(12) United States Patent
Goh et al.

(10) Patent No.: US 11,349,523 B2
(45) Date of Patent: May 31, 2022

(54) SPREAD-SPECTRUM MODULATED CLOCK SIGNAL

(71) Applicant: Intel Corporation, Santa Clara, CA (US)

(72) Inventors: Chee Kiang Goh, Singapore (SI); Mario Traeber, Singapore (SI)

(73) Assignee: Intel Corporation, Santa Clara, CA (US)

(*) Notice: Subject to any disclaimer, the term of this patent is extended or adjusted under 35 U.S.C. 154(b) by 632 days.

(21) Appl. No.: 15/673,773

(22) Filed: Aug. 10, 2017

(65) Prior Publication Data
US 2019/0052306 A1    Feb. 14, 2019

(51) Int. Cl.
| | |
|---|---|
| *H04B 1/707* | (2011.01) |
| *H04B 1/06* | (2006.01) |
| *H03L 7/087* | (2006.01) |
| *H04B 15/04* | (2006.01) |
| *H03L 7/08* | (2006.01) |
| *H03L 7/099* | (2006.01) |

(52) U.S. Cl.
CPC .............. *H04B 1/707* (2013.01); *H03L 7/08* (2013.01); *H03L 7/087* (2013.01); *H03L 7/099* (2013.01); *H04B 1/06* (2013.01); *H04B 15/04* (2013.01)

(58) Field of Classification Search
CPC ..... H03L 2207/06; H03L 7/099; H03L 7/087; H03L 2207/50; H03L 7/091; H03L 7/0996; H03L 7/08; H03L 7/089; H04B 1/707; H04B 1/06; H04B 15/04; H04B 1/69

USPC .......................................................... 375/130
See application file for complete search history.

(56) References Cited

U.S. PATENT DOCUMENTS

| | | | | |
|---|---|---|---|---|
| 2004/0252804 | A1* | 12/2004 | Aoyama | H03D 13/004 375/376 |
| 2006/0056491 | A1* | 3/2006 | Lim | H03L 7/0805 375/130 |
| 2007/0008195 | A1* | 1/2007 | Jin | H04L 7/042 341/61 |
| 2007/0091986 | A1* | 4/2007 | Wu | H04B 1/69 375/148 |
| 2009/0323768 | A1* | 12/2009 | Chan | H04B 15/04 375/130 |
| 2010/0027586 | A1* | 2/2010 | Ogasawara | H03L 7/0998 375/130 |
| 2010/0164562 | A1* | 7/2010 | Tseng | G06F 1/08 327/118 |
| 2014/0129867 | A1* | 5/2014 | Caruk | G06F 1/00 713/500 |
| 2014/0307769 | A1* | 10/2014 | He | H04L 7/0062 375/233 |
| 2017/0025929 | A1* | 1/2017 | D'angelo | H02K 11/02 |
| 2019/0052306 | A1* | 2/2019 | Goh | H04B 15/04 |

* cited by examiner

*Primary Examiner* — Vineeta S Panwalkar
(74) *Attorney, Agent, or Firm* — 2SPL Patent Attorneys PartG mbB; Yong Beom Hwang

(57) ABSTRACT

A device comprises a clock source configured to provide a spread-spectrum modulated clock signal and a control signal associated with the spread-spectrum modulated clock signal. The device also comprises a circuitry configured to receive the spread-spectrum modulated clock signal, to receive the control signal, and to sample a data signal in accordance with the spread-spectrum modulated clock signal and the control signal.

11 Claims, 7 Drawing Sheets

SPREAD-SPECTRUM MODULATED CLOCK SIGNAL

TECHNICAL FIELD

Various examples of the invention generally relate to providing a circuitry with a spread-spectrum modulated clock signal. Various examples of the invention specifically relate to a circuitry sampling a data signal in accordance with a spread-spectrum modulated clock signal and a control signal which is associated with the spread-spectrum modulated clock signal.

BACKGROUND

Digital logic elements in an electronic circuit are typically operated using a central clock signal. The clock signal is provided by a clock source which may, e.g., include a reference clock generator such as a crystal oscillator. Based on a reference clock signal output by the reference clock generator, it is then possible to determine the clock signal, e.g., by multiplying the frequency of the reference clock signal. Typical clock signals may have frequencies in the range of MHz to GHz.

Often, the electronic circuit is implemented using electric traces. An example implementation includes a printed circuit board. Here, the electric traces are configured to carry the clock signal may extend over distances of millimeters or even centimeters. Due to the frequency of the clock signal, the electric traces may act as antennas and may cause electromagnetic emission. Often, such electromagnetic emission is not desired, e.g., to avoid electromagnetic disturbances and/or dissipation of energy. Electromagnetic interference (EMI) is to be avoided.

A further source of EMI—sometimes the predominant source—may be changes in the supply current due to cyclic operation of electronic circuitry based on the clock signal.

For mitigating EMI associated with a clock signal, techniques of using a spread-spectrum modulated clock signal are known. An example technique is described in U.S. Pat. No. 5,631,920 A.

Generally, a spread-spectrum modulated clock signal includes frequency components that are spread over a certain bandwidth. This may be achieved by introducing phase shifts to the spread-spectrum modulated clock signal from clock cycle to clock cycle.

However, reference techniques of using a spread-spectrum modulated clock signal face certain restrictions and drawbacks. For example, it has been observed that certain applications may suffer from using a spread-spectrum modulated clock signal. For example, the operation of a transmission interface—such as an Ethernet communication system according to the protocol IEEE 802.3-2015, published 4 Mar. 2016—may suffer from using a spread-spectrum modulated clock signal. For example, the frequency spectrum of an analog signal provided by such a communication interface may be affected by the frequency spectrum of the spread-spectrum modulated clock signal. This may degrade the transmission reliability.

SUMMARY

Therefore, a need exists for advanced techniques of using a spread-spectrum modulated clock signal. In particular, a need exists for advanced techniques of using a spread-spectrum modulated clock signal which overcome or mitigate at least some of the above-identified limitations or drawbacks.

A device includes a clock source configured to provide a spread-spectrum modulated clock signal and a control signal. The control signal is associated with the spread-spectrum modulated clock signal. The device also includes a circuitry. The circuitry is configured to receive the spread-spectrum modulated clock signal and to receive the control signal. Then, the circuitry is configured to sample a data signal in accordance with the spread-spectrum modulated clock signal and the control signal.

A method includes receiving a spread-spectrum modulated clock signal. The method also includes receiving a control signal associated with the spread-spectrum modulated clock signal. The method also includes sampling a data signal in accordance with the spread-spectrum modulated clock signal and the control signal.

It is to be understood that the features mentioned above and those yet to be explained below may be used not only in the respective combinations indicated, but also in other combinations or in isolation without departing from the scope of the invention.

DETAILED DESCRIPTION

Figure 1:
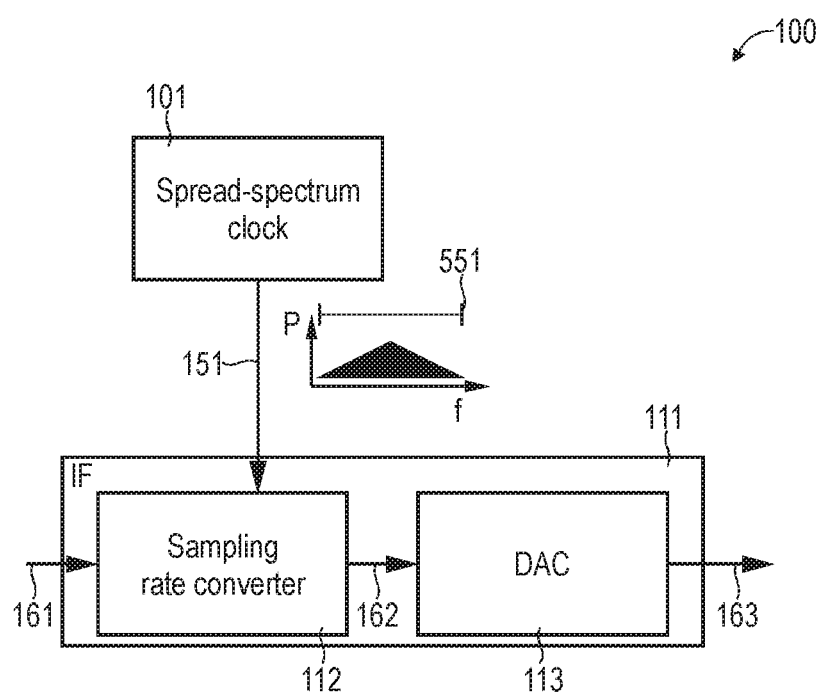
FIG. 1 schematically illustrates a device including a clock source and a communication interface according to various examples.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of processing signals using a spread-spectrum modulated clock signal are described. The techniques described herein enable to reduce the effects associated with the non-zero bandwidth across which the spread-spectrum modulated clock signal is spread on the processing of the signals. The techniques help to widely employ spread-spectrum modulated clock signals, thereby reducing EMI.

The techniques described herein may find application in various fields. For example, the techniques described herein may be applied to the operation of sampling rate converters which are often employed in combination with digital-to-analog converters (DACs) and analog-to-digital converters (ADCs). For example, such sampling rate converters in combination with a DAC or ADC may be employed in communication interfaces, e.g., between the analog front end and the digital front end of a modem. This helps to increase the transmission reliability of data encoded in a data signal and transmitted and/or received (communicated) via the communication interface.

According to examples, a control signal is provided which is associated with the spread-spectrum modulated clock signal. Then operation of circuitry may be based on, both, the spread-spectrum modulated clock signal, as well as the control signal. Thereby, it is possible to compensate or counteract negative influences of the finite bandwidth of the spread-spectrum modulated clock signal. For example, a phase shift provided to a multiplied version of the reference clock signal from clock cycle to clock cycle when determining the spread-spectrum modulated clock cycle may be taken into account when sampling a data signal. This facilitates accurate processing of data signals using the spread-spectrum modulated clock signal.

At the same time, the spread-spectrum modulated clock signal may be employed. This helps to reduce EMI. In particular, because the spread-spectrum modulated clock signal is used for sampling a data signal, the sampling operations may be arranged at variable distances in time domain; thereby, the current drawn by the respective sampling circuitry may feature a spread-out spectrum, thereby mitigating EMI. At the same time, phase shifts from cycle to cycle of the clock signal may be taken into account, e.g., by offsetting the time associated with each sampled data point of the data signal. This helps to reproduce the data signal accurately when sampling the data signal.

According to examples, the clock source is configured to provide a control signal to the circuitry which is configured to sample a data signal. Then, the circuitry is configured to sample the data signal in accordance with the spread-spectrum modulated clock signal and the control signal. The control signal may be associated with the spread-spectrum modulated clock signal.

Based on the control signal, it may be possible to conclude back on any variable phase shifts introduced from clock cycle to clock cycle of the spread-spectrum modulated clock signal, i.e., any deviations of the spread-spectrum modulated clock signal from a linear phase response. Then, such phase shifts may be taken into account, e.g., by considering an associated time offset for each sampling point of a sampled data signal.

FIG. 1 schematically illustrates aspects with respect to a device 100 according to an example. The device 100 includes a clock source 101 configured to provide a spread-spectrum modulated clock signal 151. As illustrated by the inset in FIG. 1, the energy of the spread-spectrum modulated clock signal 151 is spread across a certain bandwidth 551 in frequency domain. A typical bandwidth is in the order of a few MHz. Such a spreading of the energy of the spread-spectrum modulated clock signal 151 across the comparably large bandwidth 551 helps to avoid EMI, i.e., avoids distinct spikes in the measured electromagnetic spectrum in the vicinity of the device 100. Electromagnetic emission can be mitigated.

In the example of FIG. 1, the spread-spectrum modulated clock signal 151 is received by a circuitry 111 in the form of a communication interface. Specifically, the spread-spectrum modulated clock signal 151 is received by a sampling rate converter 112 of the communication interface 111. The sampling rate converter 112 is configured to receive a digital data signal 161 and to process the digital data signal 161 by sampling the data signal 161 at sampling points which have positions in time domain that are defined by the clock cycles of the spread-spectrum modulated clock signal. These sampled data points are then provided as an output data signal or sampled data signal 162 to a DAC 113 which converts the sampled data signal 162 to an analog data signal 163.

By sampling the data signal 161 in accordance with the spread-spectrum modulated clock signal, the spectrum of the supply current to the circuitry 111 also features the finite bandwidth 551. This mitigates EMI.

Figure 2:
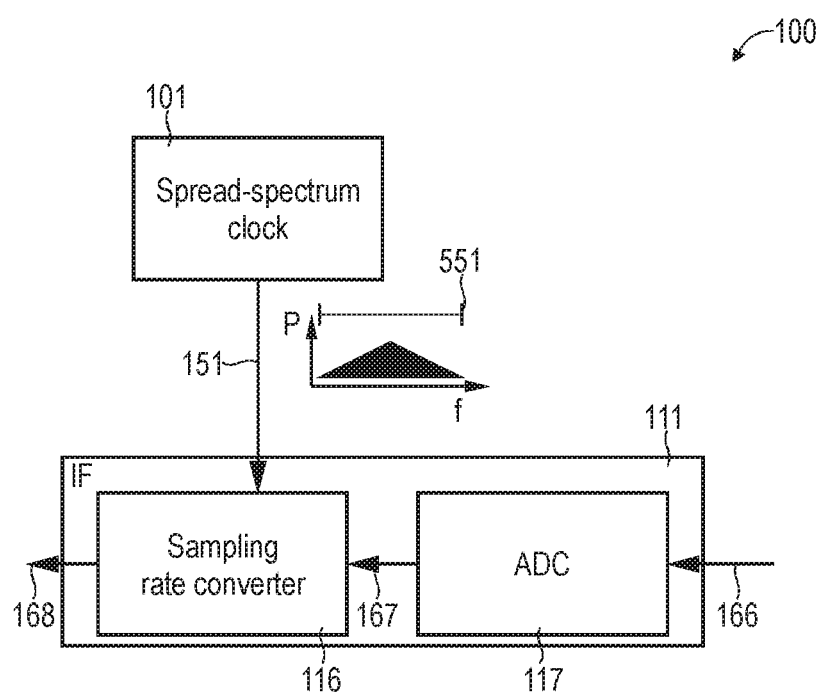
FIG. 2 schematically illustrates a device including a clock source and a communication interface according to various examples.

FIG. 2 illustrates aspects with respect to a device 100 according to a further example. The device 100 according to the example of FIG. 2 generally corresponds to the device 100 according to the example of FIG. 1. While the communication interface 111 according to the example of FIG. 1 provides transmit capability, the communication interface 111 according to the example of FIG. 2 provides receive capability. In particular, an analog data signal 166 is received by an ADC 117 which outputs a digital data signal 167. The sampling rate converter 116 processes the digital data signal 167 by sampling data points of the data signal 167 and provides a sampled data signal 168.

For example, it would be possible that the communication interfaces 111 according to the examples of FIGS. 1 and 2 implement functionality associated with a physical layer of an Ethernet communication protocol according to the IEEE 802.3.

For example the sampled data points of the sampled data signals 162, 168 may be defined as:

$$S(t+T_{clock}+\Psi(0))S(t+2T_{clock}+\Psi(1))S(t+3T_{clock}+\Psi(2)) \qquad (1)$$

where t is a reference time, Tclock is the periodicity associated with the center frequency of the spread-spectrum modulated clock signal, and $\Psi$ is the accumulated phase shift of each respective clock cycle, e.g., with respect to a reference phase. Eq. 1 is denoted for clock cycles 0, 1, and 3.

Figure 3:
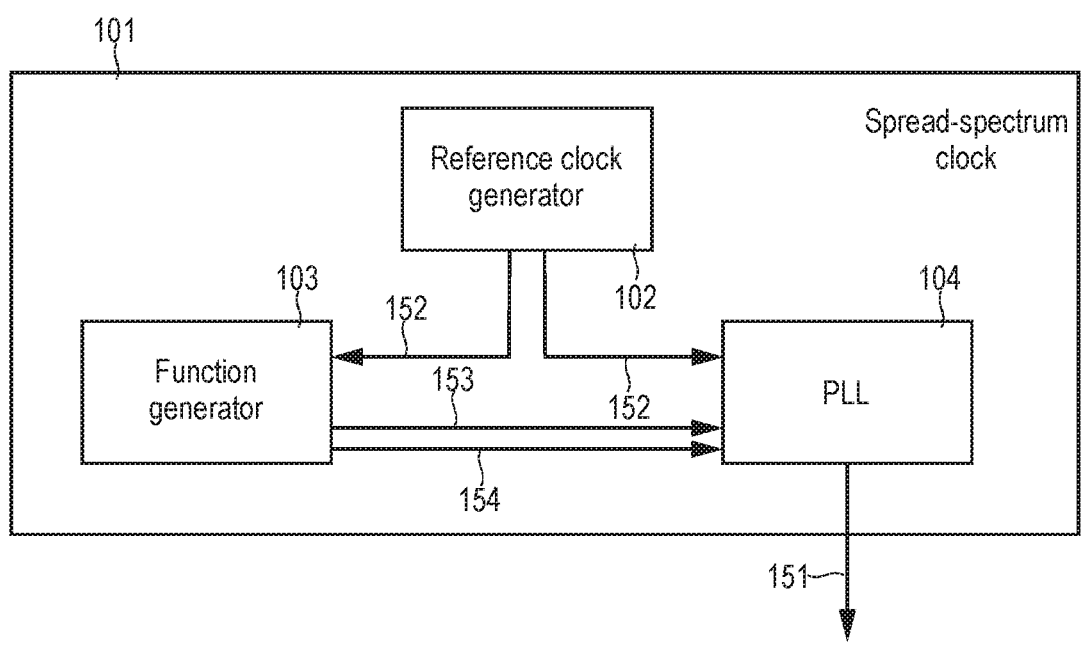
FIG. 3 schematically illustrates details of the clock source according to various examples.

FIG. 3 illustrates aspects with respect to the clock source 101. A reference clock generator 102 is configured to provide a reference clock signal 152. For example, the reference clock signal 152 may have a comparably small frequency, e.g., in the order of KHz or Hz. In particular, the frequency of the reference clock signal 152 may be 1, 2 or even 3 magnitudes of order smaller than the frequency of the spread-spectrum modulated clock signal 151. The reference clock signal 152 is provided by the reference clock generator 102 and received by a function generator 103 and a phase-locked-loop (PLL) 104. The PLL 104 may, e.g., include a Sigma-Delta modulator.

The function generator 103 is configured to receive the reference clock signal 152 and uses the reference clock signal 152 to provide phase control signals 153, 154. The phase control signals 153, 152 are received by the PLL 104. The phase control signals are indicative of a phase change φ to be applied by the PLL 104, e.g., from clock cycle to clock cycle of the spread-spectrum modulated clock signal 151. The phase change varies over time, φ=φ(t). Thereby, a finite bandwidth 551 is obtained.

The accumulated phase Ψ(n) of clock cycle n is obtained by integrating over the phase shifts for each preceding clock cycle clock cycle:

$$\Psi(n) = \Sigma_{i=0}^{n} \phi(i). \quad (2)$$

In one example implementation, the phase control signal 153 is indicative of an integer control value and the phase control signal 155 is indicative of a fractional control value. In some examples, the PLL may provide the spread-spectrum modulated clock signal 151 having a frequency which corresponds to a multiplication of the frequency of the reference clock signal 152 with the integer control value indicated by the phase control signal 153 and the fractional control value indicated by the phase control signal 154:

$$S_{151} = N \cdot F \cdot S_{152}, \quad (3)$$

where N denotes the integer control value, F denotes the fractional control value, $S_{151}$ denotes the spread-spectrum modulated clock signal and $S_{152}$ denotes the reference clock signal 152. This operation of the PLL 104 is sometimes called fractional-phase PLL.

By including a time-dependency in the generation of the fractional control value F=F(t), the phase shifts φ(t) are introduced which result in the extended bandwidth 551 of the spread-spectrum modulated control signal. For this reason, the phase control signal 154 is indicative of the phase shifts φ(t) of the spread-spectrum modulated clock signal 151.

Figure 4:
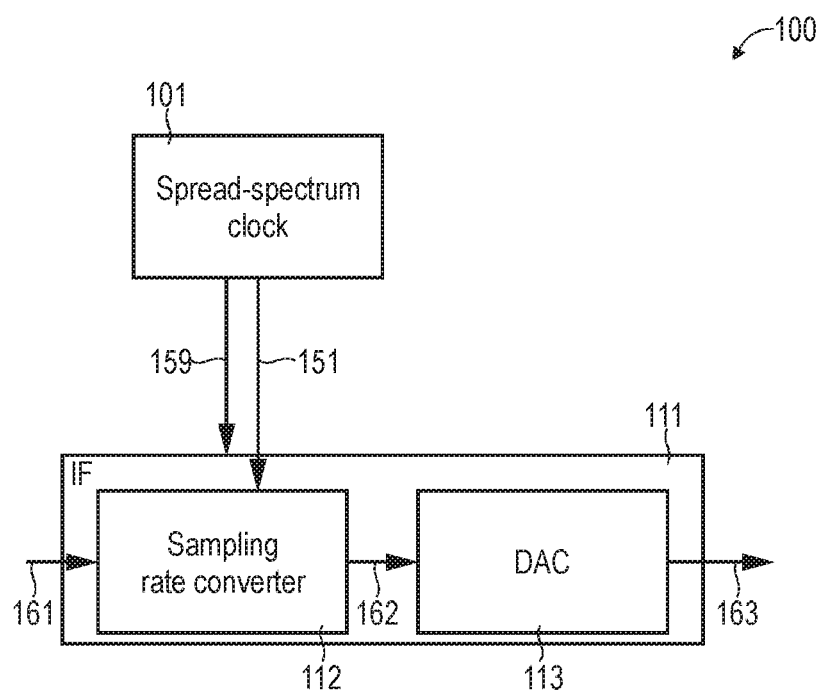
FIG. 4 schematically illustrates a device including a clock source and a communication interface according to various examples, wherein the clock source is configured to provide a control signal.

FIG. 4 illustrates aspects with respect to the device 100 according to various examples. In the example of FIG. 4, the clock source 101 is configured to provide the spread-spectrum modulated clock signal 151, as well as a control signal 159 which is associated with the spread-spectrum modulated clock signal 151. The communication interface 111 is configured to receive the control signal 159. The sampling rate converter 112 can sample the data signal 161 in accordance with the spread-spectrum modulated clock signal 151 and in accordance with the control signal 159.

For example, it would be possible that the control signal 159 is determined based on the phase control signal 154; the control signal 159 may correspond to a scaled version of the phase control signal 154, a gain offset may be provided. Then, because the phase control signal 154 is indicative of the phase shift φ(t) of the various clock cycles of the spread-spectrum modulated clock signal 151, it would be possible to take into account corresponding time shifts when sampling the data signal 161. For example, the control signal 159 may be equal to the phase control signal 154.

Figure 5:
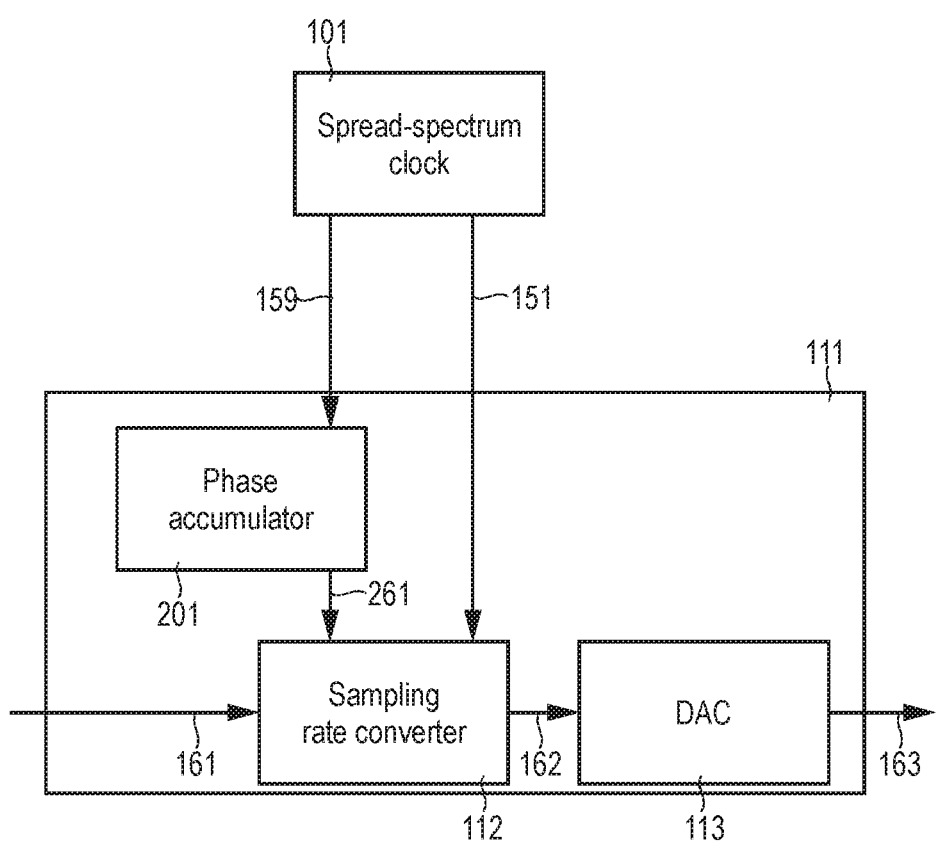
FIG. 5 schematically illustrates a device including a clock source and a communication interface according to various examples, wherein the clock source is configured to provide a control signal.

FIG. 5 illustrates aspects with respect to the device 100 according to various examples. In particular, FIG. 5 illustrates aspects with respect to sampling the data signal 161 in accordance with, both, the control signal 159, as well as the spread-spectrum modulated clock signal 151.

In the example of FIG. 5, the control signal 159 is received by a phase accumulator 201. The phase accumulator 201 determines a compensation signal 261 based on the control signal 159. In particular, the phase accumulator 201 tracks the phase changes of the spread-spectrum modulated clock signal resulting from the phase control signal 154 and indicated by the control signal 159. The phase accumulator 201 can determine the compensation signal 261 based on an integral of the phase shifts across the plurality of clock cycles, see Eq. 2. Thereby, the compensation signal 261 can be indicative of the absolute phase shift of each individual clock cycle of a plurality of clock cycles of the spread-spectrum modulated clock signal 151, i.e., of Ψ(n). This accumulated phase shift Ψ(n) with respect to a reference phase can be indicated by the compensation signal 261. The compensation signal 261 is then provided to the sampling rate converter 112.

The sampling rate converter 112 can then associate each sampling point of the sampled data signal 161 with a time offset, the time offset being determined based on the accumulated phase shift. Details of this process are illustrated in connection with FIGS. 6A-6D.

FIGS. 6A-6D illustrates aspects with respect to accurately sampling a data signal 161 (dashed line). FIGS. 6A-6D illustrate the signal evolution of the data signal 161 over time, in particular at a plurality of clock cycles 281 (dots in FIGS. 6A-6D).

Figure 6A:
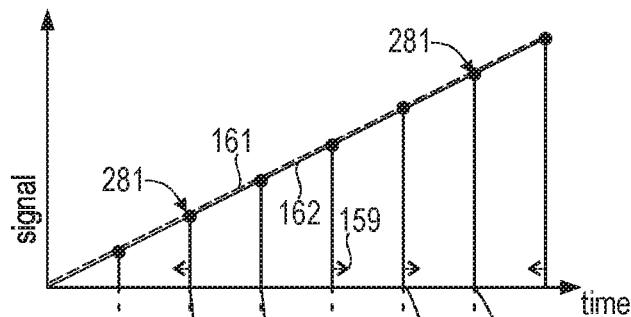
FIGS. 6A-6D schematically illustrate sampling of a data signal in accordance with a spread-spectrum modulated clock signal and a control signal associated with the spread-spectrum modulated clock signal.
Figure 6B:
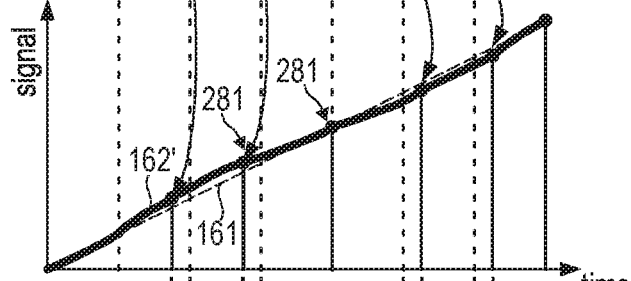

FIG. 6A illustrates sampling of the data signal 161 using a non-modulated reference clock signal (in the illustrated example, the data signal 161 has values which linearly increase over the course of time; however, generally, the data signal may have values which take an arbitrary shape in time domain); therefore, the clock cycles 281 are evenly spaced in time-domain (horizontal axis). Thus, the sampling points are also evenly spaced. The bandwidth of this reference clock signal would be small, in particular smaller than the bandwidth 551 of the spread spectrum modulated clock signal 151. At each clock cycle 281, the data points of the sampled data signal 162 (full line) accurately reproduce the data signal 161. The scenario of FIG. 6A is associated with significant EMI. In particular, the power drawn by the sampling rate converter when sampling the data points exhibits strictly periodic spikes having a narrow bandwidth according to the reference clock signal.

When using a spread-spectrum modulated clock signal, as explained above with respect to FIG. 3, there is a time dependency of the phase control signal 154, i.e., the fractional control value changes within certain boundaries. This is reflected by the control signal 159 which is indicative of such phase shifts φ(i) of a plurality of the clock cycles of the spread-spectrum modulated clock cycle 151. As can be seen from FIG. 6B, this results in non-evenly spaced clock cycles 281. The non-evenly spaced clock cycles 281 lead to a distorted sampled signal 162'.

By relying on the control signal 159—which is indicative of the phase shifts φ(i) associated with the fractional control value—it is possible to compensate for such phase shifts φ(i). In particular, it would be possible to consider the time offset 279 of each clock cycle. Then, the respective sampling data points can be associated with the corrected absolute time by considering the time offsets 270.

Figure 6C:
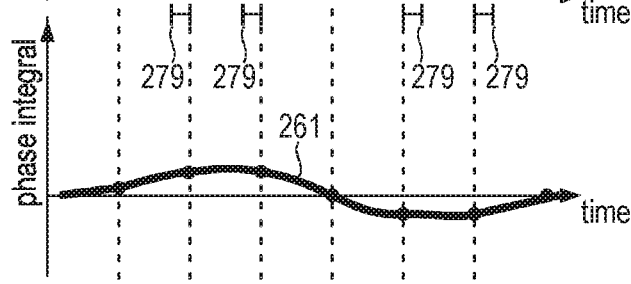
Figure 6D:
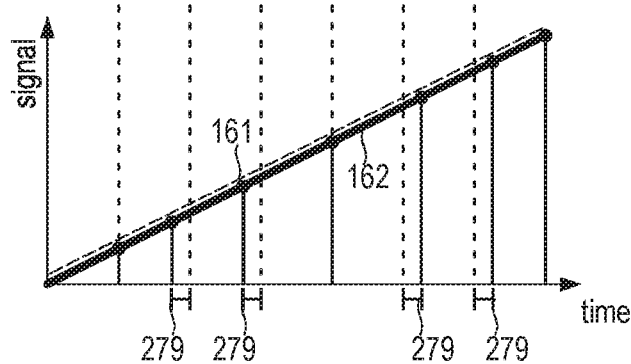

To obtain the time offsets 279, the accumulated phase shift Ψ(i) is determined by summing over the individual phase shifts indicated by the control signal 159, see Eq. 2. This corresponds to an integral of the phase shifts across the plurality of clock cycles. FIG. 6C illustrates the corresponding compensation signal 261 which is determined based on this integral.

Based on the compensation signal 261, i.e., based on the accumulated phase shift, it is then possible to determine the time offsets 279. These time offsets can be considered when sampling the data signal 161, cf. FIG. 6D This reduces a distortion in the sampling.

While above, various examples have been explained in connection with a communication interface 111 providing transmit functionality, similar techniques may be readily employed for a communication interface 111 providing receive functionality. Here, the correct data points can be interpolated from the ADC samples. Distortions can be avoided. The signal-to-noise ratio can be increased.

Figure 7:
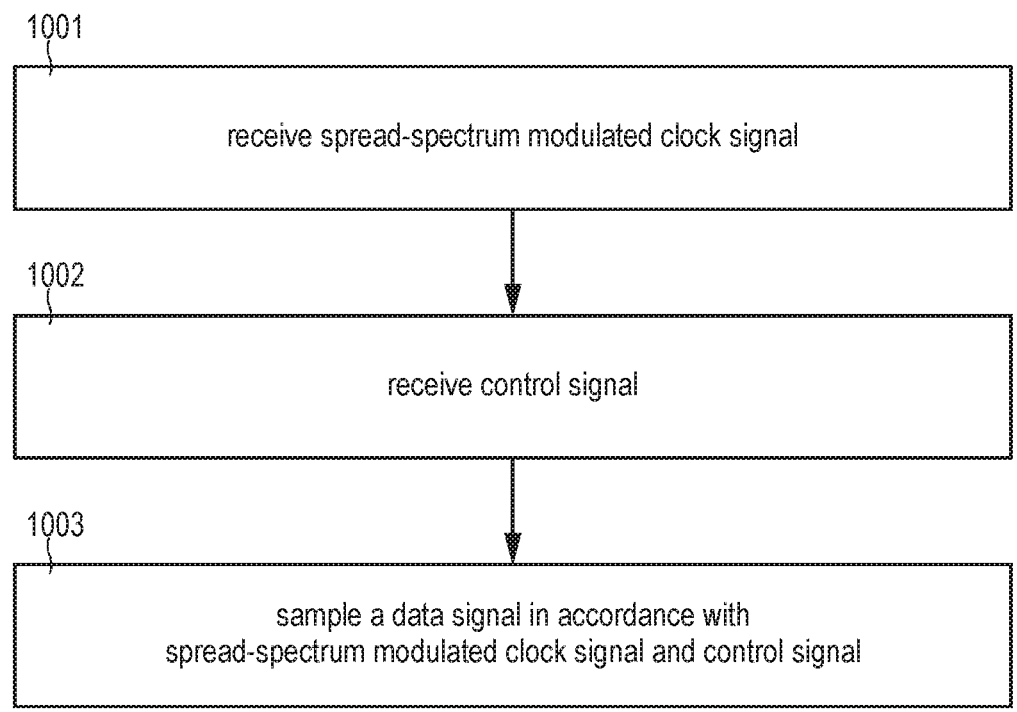
FIG. 7 is a flowchart of a method according to various examples.

FIG. 7 is a flowchart of a method according to examples. In block 1001, a spread-spectrum modulated clock signal is received. For example, the spread-spectrum modulated clock signal can be received from a clock source which employs a fractional PLL clock generator.

In block 1002, a control signal is received. The control signal is associated with the spread-spectrum modulated clock signal. For example, the control signal may be indicative of phase shifts of a plurality of clock cycles of the spread-spectrum modulated clock signal. In some examples, the control signal may correspond to a fractional control value provided to a fractional PLL clock generator by a respective frequency generator.

Then, in block 1003, a digital data signal is processed, e.g., sampled, in accordance with the spread-spectrum modulated clock signal and the control signal. The digital data signal may be received from an ADC or may be provided to DAC. Here, time offsets between sampling points may be taken into account; the time offsets may be determined based on the control signal.

Summarizing, various examples described herein are based on the finding that a clock source configured to provide a spread-spectrum modulated clock signal typically uses a small fractional adjustment in a PLL to adjust the frequency of the spread-spectrum modulated clock signal from clock cycle to clock cycle. Then, a scaled version of this fractional control value can be used in the phase compensation circuit to predict the change in the phase of the spread-spectrum modulated clock signal from clock cycle to clock cycle with high precision. This may be used in connection with the digital fractional sampling rate converter to correctly generate the sample at a compensated phase such that the effect of the clock frequency spread of the spread-spectrum modulated clock signal is reduced or removed, i.e., compensated. This may help to implement high accuracy communication.

Summarizing, at least the following examples have been described:

Example 1

A device (100) for sampling a data signal, comprising:
a circuitry (111) configured
to receive a spread-spectrum modulated clock signal (151),
to receive a control signal (159) associated with the spread-spectrum modulated clock signal, and
to sample a data signal (161, 166) in accordance with the spread-spectrum modulated clock signal (267) and the control signal (159).

Example 2

The device of example 1,
wherein the control signal (159) is indicative of phase shifts ($\phi$) of a plurality of clock cycles (281) of the spread-spectrum modulated clock signal (151).

Example 3

The device (100) of examples 1 or 2,
wherein the circuitry (111) is configured to determine a compensation signal (261) based on the control signal (159).

Example 4

The device (100) of examples 2 and 3,
wherein the circuitry (111) is configured to determine the compensation signal (261) based on an integral of the phase shifts ($\phi$) across the plurality of clock cycles (281).

Example 5

The device (100) of examples 3 or 4,
wherein the compensation signal (261) is indicative of the accumulated phase shift ($\Psi$) of each clock cycle (281) of a plurality of clock cycles (281) of the spread-spectrum modulated clock signal (151) with respect to a reference phase.

Example 6

The device (100) of any one of the preceding examples,
wherein the circuitry (111) is configured to associate sampling points of the sampled data signal (162, 167) with time offsets (279) determined based on the control signal.

Example 7

The device (100) of any one of the preceding examples,
wherein the circuitry (111) is configured to sample a digital data signal (161) and to provide the sampled data signal (162) to a digital-to-analog circuitry (111) interfacing a digital front end and an analog front end of a communication interface, or
wherein the circuitry (111) is configured to sample a data signal (167) output by an analog-to-digital converter interfacing an analog front end and a digital front end of a communication interface.

Example 8

The device (100) of any one of the preceding examples,
wherein a frequency spread of the spread-spectrum modulated clock signal (151) is at least 200 ppm, optionally at least 500 ppm.

Example 9

A system, comprising:
the device of any one of the preceding examples,
a clock source (101) configured to provide a spread-spectrum modulated clock signal (151) and a control signal (159) associated with the spread-spectrum modulated clock signal (151),
wherein the clock source (101) comprises a phased-lock loop (104) configured to receive a phase control signal (153, 154) indicative of a phase change and to provide the spread-spectrum modulated clock signal (151) based on the phase control signal (153, 154),
wherein the clock source (101) is configured to determine the control signal (159) based on the phase control signal (153, 154).

Example 10

A method of sampling a data signal, comprising:
receiving a spread-spectrum modulated clock signal (151),
receiving a control signal (159) associated with the spread-spectrum modulated clock signal (151),
sampling a data signal (161, 166) in accordance with the spread-spectrum modulated clock signal (267) and the control signal (159).

Example 11

The method of example 10,
wherein the control signal (159) is indicative of phase shifts ($\phi$) of a plurality of clock cycles (281) of the spread-spectrum modulated clock signal (151).

Example 12

The method of examples 10 or 11, further comprising:
determining a compensation signal (261) based on the control signal (159).

Example 13

The method of example 12,
wherein the compensation signal (261) is determined based on an integral of the phase shifts ($\phi$) across the plurality of clock cycles (281).

Example 14

The method of examples 12 or 13,
wherein the compensation signal (261) is indicative of the accumulated phase shift ($\Psi$) of each clock cycle (281) of a plurality of clock cycles (281) of the spread-spectrum modulated clock signal (151) with respect to a reference phase.

Example 15

The method of any one of examples 10-14, further comprising:
associating sampling points of the sampled data signal (162, 167) with time offsets (279) determined based on the control signal.

Example 16

The method of any one of examples 10-15, further comprising:
receiving a phase control signal (153, 154) indicative of a phase change, providing the spread-spectrum modulated clock signal (151) based on the phase control signal (153, 154),
determining the control signal (159) based on the phase control signal (153, 154).

Example 17

The method of any one of examples 10-16, further comprising:
sampling a digital data signal (161),
providing the sampled data signal (162) to a digital-to-analog circuitry (111) interfacing a digital front end and an analog front end of a communication interface.

Example 18

The method of any one of examples 10-16, further comprising:
sampling a data signal (167) output by an analog-to-digital converter interfacing an analog front end and a digital front end of a communication interface.

Example 19

The method of any one of examples 10-18,
wherein a frequency spread of the spread-spectrum modulated clock signal (151) is at least 200 ppm, optionally at least 500 ppm.

Example 20

A computer program product comprising program code that may be executed by control circuitry, wherein executing the program code causes the control circuitry to:
receive a spread-spectrum modulated clock signal (151),
receive a control signal (159) associated with the spread-spectrum modulated clock signal (151),
sample a data signal (161, 166) in accordance with the spread-spectrum modulated clock signal (267) and the control signal (159).

Example 21

A computer program comprising program code that may be executed by control circuitry, wherein executing the program code causes the control circuitry to:
receive a spread-spectrum modulated clock signal (151),
receive a control signal (159) associated with the spread-spectrum modulated clock signal (151),
sample a data signal (161, 166) in accordance with the spread-spectrum modulated clock signal (267) and the control signal (159).

Example 22

A device for sampling a data signal, comprising:
means for receiving a spread-spectrum modulated clock signal (151),
means for receiving a control signal (159) associated with the spread-spectrum modulated clock signal (151),
means for sampling a data signal (161, 166) in accordance with the spread-spectrum modulated clock signal (267) and the control signal (159).

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For example, while various examples have been described in connection with sampling rate converters, in other examples it would also be possible to provide implement the techniques in connection with other kinds and types of digital logic elements.

The invention claimed is:
1. A device for sampling a data signal, comprising:
a circuitry configured to:
receive a spread-spectrum modulated clock signal,
receive a control signal associated with the spread-spectrum modulated clock signal, wherein the control signal is indicative of phase shifts ($\phi$) of a plurality of clock cycles of the spread-spectrum modulated clock signal, and sample a data signal in accordance with the spread-spectrum modulated clock signal and the control signal.

2. The device of claim 1, wherein the circuitry is configured to associate sampling points of the sampled data signal with time offsets determined based on the control signal.

3. The device of claim 1, wherein the circuitry is configured to sample the data signal as a digital data signal and to provide the sampled data signal to a digital-to-analog circuitry interfacing a digital front end and an analog front end of a communication interface, or wherein the circuitry is configured to sample the data signal output by an analog-to-digital converter interfacing an analog front end and a digital front end of a communication interface.

4. The device of claim 1, wherein a frequency spread of the spread-spectrum modulated clock signal is at least 200 ppm.

5. The device of claim 1, further comprising:

a clock source configured to provide the spread-spectrum modulated clock signal and the control signal associated with the spread-spectrum modulated clock signal, wherein the clock source comprises a phased-lock loop configured to receive a phase control signal indicative of a phase change and to provide the spread-spectrum modulated clock signal based on the phase control signal, wherein the clock source is configured to determine the control signal based on the phase control signal.

6. A device for sampling a data signal, comprising:

a circuitry configured to:

receive a spread-spectrum modulated clock signal, receive a control signal associated with the spread-spectrum modulated clock signal, and sample a data signal in accordance with the spread-spectrum modulated clock signal and the control signal, wherein the circuitry is configured to determine a compensation signal based on the control signal, and wherein the compensation signal is indicative of the accumulated phase shift ($\Psi$) of each clock cycle of a plurality of clock cycles of the spread-spectrum modulated clock signal with respect to a reference phase.

7. A method of sampling a data signal, comprising:

receiving a spread-spectrum modulated clock signal, receiving a control signal associated with the spread-spectrum modulated clock signal, wherein the control signal is indicative of phase shifts ($\phi$) of a plurality of clock cycles of the spread-spectrum modulated clock signal, and sampling a data signal in accordance with the spread-spectrum modulated clock signal and the control signal.

8. The method of claim 7, further comprising:

determining a compensation signal based on the control signal.

9. The method of claim 8, wherein the compensation signal is determined based on an integral of the phase shifts ($\phi$) across the plurality of clock cycles.

10. The method of claim 8, wherein the compensation signal is indicative of the accumulated phase shift ($\Psi$) of each clock cycle of a plurality of clock cycles of the spread-spectrum modulated clock signal with respect to a reference phase.

11. The method of claim 7, further comprising:

associating sampling points of the sampled data signal with time offsets determined based on the control signal.

* * * * *